United States Patent [19]
Defosse

[11] 3,994,690
[45] Nov. 30, 1976

[54] UNIVERSAL APPARATUS FOR ELABORATING SEMICONDUCTIVE MONOCRYSTALS

[75] Inventor: Georges Jean-Pierre Hubert Defosse, Wandre, Belgium

[73] Assignee: Elphiac, Brussels, Belgium

[22] Filed: Feb. 13, 1975

[21] Appl. No.: 549,789

[30] Foreign Application Priority Data
Feb. 15, 1974 Belgium .................................. 15725

[52] U.S. Cl. ....................... 23/273 SP; 156/617 SP; 156/620
[51] Int. Cl.² ...................... B01J 17/10; B01J 17/18
[58] Field of Search ........... 23/273 Z; 156/617–618, 156/619, 620, 600, 616

[56] References Cited
UNITED STATES PATENTS

| | | | |
|---|---|---|---|
| 2,809,905 | 10/1957 | Davis.............................. | 23/273 Z |
| 2,870,309 | 1/1959 | Capita............................. | 23/273 Z |
| 3,189,415 | 6/1965 | Erneis ............................. | 23/273 Z |
| 3,216,805 | 11/1965 | Erneis ............................. | 23/273 Z |
| 3,592,611 | 7/1971 | Eder................................ | 23/273 Z |
| 3,650,701 | 3/1972 | Forrat............................. | 156/617 SP |
| 3,692,499 | 9/1972 | Andrychuk...................... | 156/617 SP |

FOREIGN PATENTS OR APPLICATIONS

| | | | |
|---|---|---|---|
| 629,412 | 10/1961 | Canada........................... | 156/617 SP |
| 1,150,947 | 7/1963 | Germany........................ | 156/617 SP |
| 1,011,973 | 12/1965 | United Kingdom ............ | 156/617 SP |
| 139,440 | 6/1960 | U.S.S.R............................ | 23/273 Z |

OTHER PUBLICATIONS
Keck et al., Floating Zone Recrystallization of Silicon, The Rev. of Scien. Instr., vol. 25, No. 4, Apr., 1954, pp. 331 to 334.

Primary Examiner—Stephen J. Emery
Attorney, Agent, or Firm—Bacon & Thomas

[57] ABSTRACT

Universal apparatus for elaborating semiconductive monocrystals according to known methods, comprising a frame, a heating enclosure, heating means located in this enclosure and connected to an appropriate electric current generator, a vacuum system connected to the enclosure, means for admission of gases in the enclosure, and means for supporting, drawing and rotating the crystalline material during its elaboration. The heating enclosure is the same for all the methods inasmuch as the quantities of the crystalline material treated are comparable and comprises a cylindrical body fixed at a predetermined height to the frame for visual observation of the elaboration zone, the body being provided with two lateral flanges for ensuring the connection of the vacuum system or of an eventual generator of radiofrequency, and two caps, one lower cap and one upper cap, the caps being removably connected to the cylindrical body. The lower cap is provided with means for eventually supporting heating elements and further elements. The means for supporting, drawing and rotating, which differ completely or partly according to the used method, are constituted by modular units provided with identical assemblage means between themselves and with the caps of the enclosure in such a way as to permit the positioning above the upper cap and below the lower cap modular units suitable for the chosen method. At least one of the upper modular units is provided with means for providing its assembling with a first slide displaceable on guides provided on the frame, and at least one of the lower modular units is provided with means for providing its assembling with a second slide displaceable on the same guides. Each slide is provided with fixation means to a nut, the nut being activated by a main screw running along the guides of the frame and with accurate positioning means and locking means at predetermined spots of the guides.

2 Claims, 2 Drawing Figures

UNIVERSAL APPARATUS FOR ELABORATING SEMICONDUCTIVE MONOCRYSTALS

The present invention relates to an universal apparatus for elaborating semiconductive monocrystals.

The known methods used for elaborating semiconductive monocrystals or the like, i.e. Floating Zone, Czochralsky, Pedestal Pulling, Bridgman methods, mainly necessitate a means of heating by induction or resistance located in an enclosure connected to a vacuum system and means for supporting, drawing and rotating the crystalline material during its production or elaboration.

The industrial apparatuses built up to date to this end have been conceived as a function of the used method and differ from each other by the disposition of the enclosure according to the used heating means and by the number, the characteristics, the dimensions and the location of the means for supporting, drawing and rotating the material.

The apparatus according to the present invention, due to the easy substitution of one heating means by another in an enclosure which remains the same for all the methods inasmuch as the quantity of the treated crystalline material is comparable, and due to a modular conception of the means for supporting, drawing and rotating, may, provided a supplemental investment for a small number of modular substitute units is done, be adapted to one of the known methods in a minimum of time, without any important handling means, without tiresome adjustments and without special equipment.

The apparatus according to the present invention comprises a frame, a heating enclosure, heating means located in the enclosure and connected to an appropriate electrical current generator, a vacuum system connected to the enclosure, intake or admission means for the eventual admission of gases into the enclosure and means for supporting, drawing and rotating the crystalline material during its elaboration. The heating enclosure is the same for all the methods inasmuch as the quantities of the crystalline material treated are comparable, and comprises a cylindrical body fixed at a predetermined height to the frame for visual observation of the elaboration zone, the body being provided with two lateral flanges for ensuring the connection of the vacuum system or of an eventual generator of radiofrequency, and two caps, one lower cap and one upper cap, the caps being removably connected to the cylindrical body. The lower cap is provided with means for eventually supporting heating elements and further internal elements. The means for supporting, drawing and rotating, which differ completely or partly according to the used method, are constituted by modular units provided with identical assemblage means between themselves and with the caps of the enclosure in such a way as to permit the positioning above the upper cap and below the lower cap modular units suitable for the chosen method. At least one of the upper modular units is provided with means for providing its assembling with a first slide displaceable on guides provided on the frame, and at least one of the lower modular units is provided with means for providing its assembling with a second slide displaceable on the same guides. Each slide is provided with fixation means to a nut, the nut being activated by a main screw running along the guides of the frame, and with accurate positioning means and locking means at predetermined spots of the guides.

The object and a fuller understanding of the invention may be had by referring to the following description and claims, taken in conjunction with the accompanying drawings in which:

Figure 1:
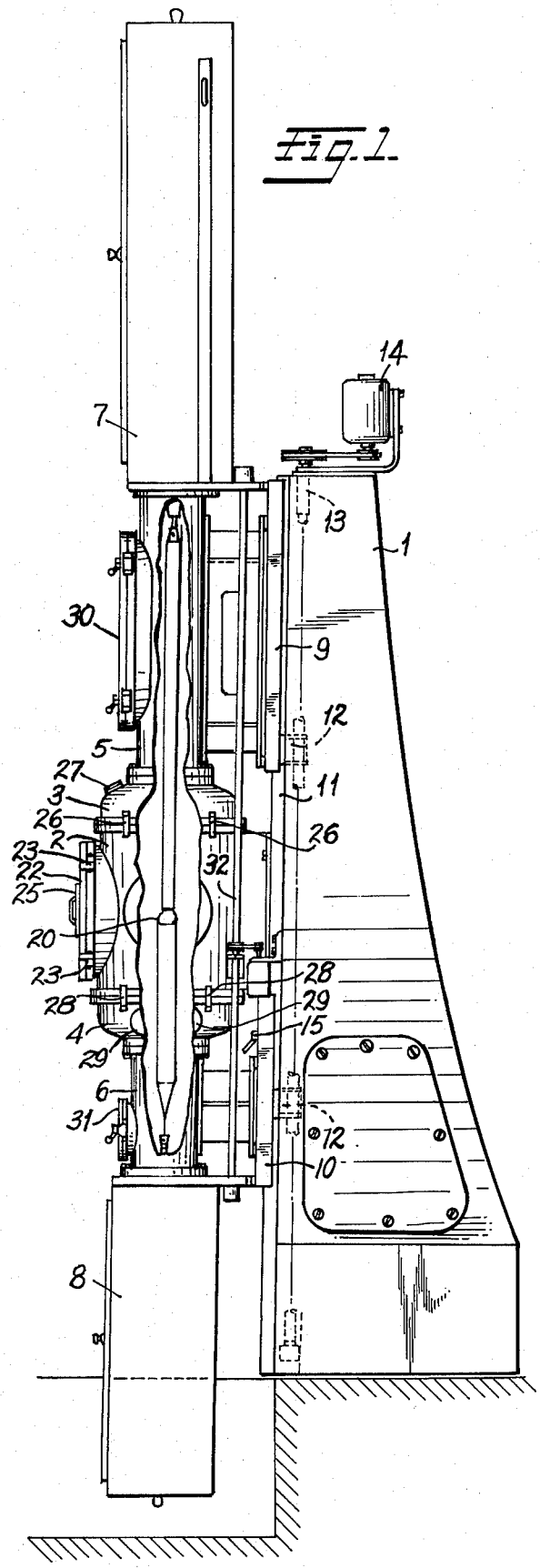
FIG. 1 is a lateral view of the apparatus according to the present invention when the apparatus is assembled for functioning according to the "Floating Zone" method.

In FIG. 1 a vertical part has been removed for showing the arrangement inside the apparatus of a bar of crystalline material during its elaboration.

Figure 2:
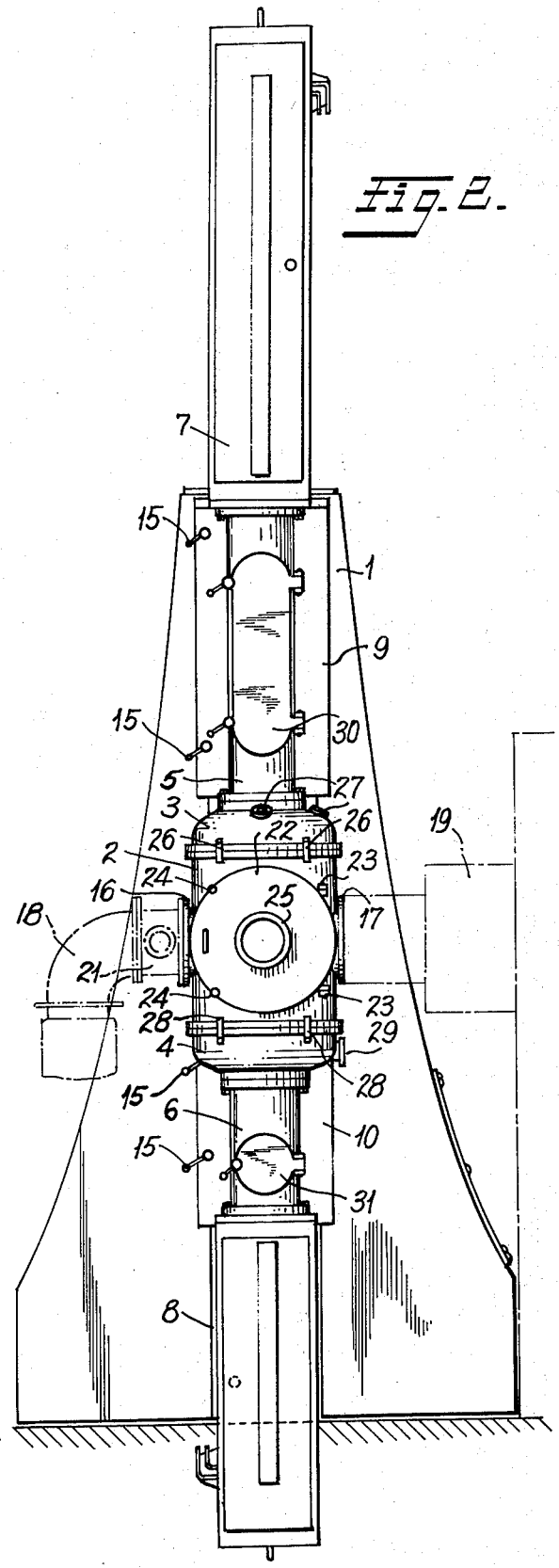
FIG. 2 is a front view of the same apparatus in the same functioning condition.

As shown in FIGS. 1 and 2, the apparatus comprises a frame 1 supporting a heating enclosure comprising a cylindrical body 2, an upper cap 3 and a lower cap 4. The heating enclosure extends upwardly by an upper cross-piece 5 and downwardly by a lower cross-piece 6. An upper mechanism 7 is connected above the upper cross-piece 5 and a lower mechanism 8 is connected below the lower cross-piece 6 for the drawing and the rotating of the material.

As shown in FIG. 1, the upper cross-piece 5 and the upper mechanism 7 are furthermore provided with fixation tabs or flaps providing the lateral fixation of these upper elements to an upper slide 9. The lower cross-piece 6 and the lower mechanism 8 are also provided with fixation taps adapted to laterally secure the lower elements to a lower slide 10. The slides 9 and 10 are slidable in vertical guides 11 of the frame owing to the presence of a removable nut 12 which may be fixed on either slide according to the need as it will be explained in a later paragraph. The nut 12 is activated by a main screw 13 running along the guides of the frame and actuated by a motor 14. In the working position as shown in the figures, the two slides are immobilized on the guides by means of manual levers 15. The cylindrical body 2 of the heating enclosure is provided with two lateral circular identical flanges 16 and 17. The flange 16 is provided for ensuring the connection of a vacuum system, shown in dash-dot lines 18 in FIG. 2, and the flange 17 is provided for ensuring the connection of a generator of radiofrequency to the main body 2, as shown in dash-dot lines 19 in FIG. 2. As the flanges 16 and 17 are identical, the location of the vacuum system and the generator of radiofrequency may be inverted according to the best convenience of the general implantation.

In order to permit the lateral observation of the zone of the inductor (the inductor not being shown in the figures) located at 20 in FIG. 1, it is provided at the vacuum pump side a special observation system, shown in dash-dot lines 21 in FIG. 2. The inside of the cylindrical body 2 is accessible through a door 22 located in the front face of the body, pivoting on hinges 23, closed by clamps 24 and provided with a bull's eye or porthole 25 aiming frontally the inductor.

The dimensioning of the door permits an easy access to the internal parts of the body and the easy extraction of the long bars.

The upper cap 3 is fixed to the cylindrical body 2 by means of removable clamps 26 and is provided with sockets 27 which may be used in either method for the fixation of observation portholes or devices for measuring, controlling an regulating.

The lower cap 4 is fixed to the cylindrical body 2 by removable clamps 28 and is conceived for supporting heating elements or other internal fixed elements in the case where the apparatus of the present invention is converted for operating according to the Czochralsky or Bridgman methods. The lower cap 4 comprises two flanges 29 provided for the fixation of fixtures of industrial frequency current for the feeding of the heating elements, if this is the case.

The cross-pieces 5 and 6 comprises, as the heating enclosure, admission doors 30 and 31 which permit an easy inside cleaning and an easy fixation of the bars or the germs.

The cross-pieces 5 and 6 also comprise passages with standard flanges for the eventual admission of gases in the enclosure when this is required by the elaboration process (the gas admission means are not shown in the drawings, neither the water inlet and outlet connections for the cooling of the enclosure and the cross-pieces, which are made of double walls to this effect).

The mechanisms 7 and 8, from the terminal hooks of which is supported the crystalline bar, (shown in FIG. 1) are high precision mechanical and electrical machines which ensure the rotation and the drawing of the material without shocks or vibrations, with speeds adjusted on very wide ranges. In FIG. 1, it is shown an axis 32 serving for the synchronization of the speeds of the two mechanisms.

As above mentioned, the number, the characteristics and the location of the means for supporting, drawing and rotating, here constituted by the cross-pieces 5 and 6 and mechanisms 7 and 8 for the operation according to the "Floating Zone", should be capable of differing totally or partly if another method is desired to be used.

Thus, for the production or elaboration of monocrystals of the same dimensions by the "Czochralsky" method, the upper cross-piece and the upper mechanism are the same as in the "Floating Zone" method, but there is no lower cross-piece and the lower mechanism is different. On the other hand, for the "Bridgman" method, there is no upper mechanism and the lower mechanism is the same as the mechanism in the "Floating Zone" method.

For the above reasons the inventor has conceived the cross-pieces 5 and 6 and the mechanisms 7 and 8 as modular units or elements which are capable of being easily assembled with each other and with the caps 3 and 4 and easily removed and eventually replaced by substitute units of different dimensions and characteristics. Therefore, it is necessary that the end to end assembling of these units be identical and, as in the present case, shown in the two figures of the drawings, that the cross-pieces 5 and 6 terminate by identical circular flanges pierced with holes for the insertion of screws, whereas the caps 3 and 4 and the mechanisms 7 and 8 be provided with threaded holes for receiving the screws. Furthermore, as above mentioned, the modular units 5 and 7 on the one hand and the units 6 and 8 on the other hand are provided with fixation tabs for ensuring, by means of bolts the lateral fixation of these units to the slides 9 and 10, respectively, the slides being themselves provided with accurate positioning means in predetermined spots on the guides 11 of the frame.

By thoroughly using the following characteristics:
a. conceiving of means for supporting, drawing and rotating, in the form of modular units, (in the present embodiment cross-pieces 5 and 6 and mechanisms 7 and 8 for the "Floating Zone" method or substitute units for the other methods), which are vertically assembled to each other and to the caps 3 and 4 of the heating enclosure by identical bolted assemblages, b. removably laterally fixing the upper modular units 5 and 7 to the slide 9 and the lower modular units 6 and 8 to the slide 10, c. possibility, after fixing the slide 9 or the slide 10 with the removable nut 12, of moving the slides 9 and 10 on the vertical guides 11 of the frame with an accurate supervision of positioning, the assembling, the disassembling and the evenutal conversion of the apparatus for passing from one method to the other may be made in a minimum of time, without any difficult adjustment and without any important handling means.

Furthermore, during the operation of the apparatus by one or the other method, it is possible, without disassembling, simply by removing the clamps 26 and by displacing the slide 9 upwardly, which in the described embodiment raises the entire assembly 3-5-7, to have access from the above to the inside of the enclosure, and, simply by removing the clamps 28 and by displacing the slide 10 downwardly, which in the described embodiment lowers the assembly 4-6-8, to completly remove the eventual internal units (for instance heating elements, crucible, etc, in the Czochralsky method) supported by lower cap 4.

The embodiments of the invention in which an exclusive property or privilege is claimed are defined as follows:

1. Modular apparatus for fabricating monocrystalline semiconductor articles, said apparatus comprising:
   a. a main frame;
   b. a subdivided cylindrical heating enclosure attached to said frame, said enclosure having upper and lower end caps removably attached at the open terminal ends thereof and two lateral circumferential flange means for selective, removable attachment of vacuum means and energy generating means thereto, said upper and lower end caps being removably attached to said heating enclosure by removable clamps;
   c. crystal supporting, drawing, and rotating means selectively, removably attached to said end caps, said crystal supporting, drawing and rotating means comprising modular units selectively removably attached to said end caps through bolted flanges;
   d. displaceable slide means guide means attached to said frame for receiving said displaceable slide means, said slide means functionally engaged with said supporting, drawing, and rotating means for accurate positioning rotative to said end caps, said slide means including an upper and lower slide displaceable by a single screw and a single removeable nut;
   e. rotatable screw means cooperating with fixation means on said slide means for displacement thereof; and
   f. locking means to secure said supporting, drawing, and rotating means.

2. The apparatus of claim 1, further comprising:
   g. heating means operatively communicating with a source of energy therefor, said heating means disposed within said heating enclosure; and
   h. means for controlled admission and removal of gas to said enclosure.

* * * * *